US010672496B2

(12) United States Patent
Alzheimer et al.

(10) Patent No.: US 10,672,496 B2
(45) Date of Patent: Jun. 2, 2020

(54) DEVICES AND METHODS TO WRITE BACKGROUND DATA PATTERNS IN MEMORY DEVICES

(71) Applicant: Micron Technology, Inc., Boise, ID (US)

(72) Inventors: Joshua E. Alzheimer, Boise, ID (US); Gary Howe, Plano, TX (US); Harish N. Venkata, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 374 days.

(21) Appl. No.: 15/792,473

(22) Filed: Oct. 24, 2017

(65) Prior Publication Data

US 2019/0122744 A1    Apr. 25, 2019

(51) Int. Cl.
| | | |
|---|---|---|
| *G11C 29/00* | (2006.01) | |
| *G11C 29/10* | (2006.01) | |
| *G11C 29/02* | (2006.01) | |
| *G11C 29/12* | (2006.01) | |
| *G11C 29/16* | (2006.01) | |
| G11C 29/46 | (2006.01) | |
| G11C 29/20 | (2006.01) | |

(52) U.S. Cl.
CPC .......... *G11C 29/10* (2013.01); *G11C 29/021* (2013.01); *G11C 29/028* (2013.01); *G11C 29/1201* (2013.01); *G11C 29/16* (2013.01); *G11C 29/20* (2013.01); *G11C 29/46* (2013.01)

(58) Field of Classification Search
CPC .................................................... G11C 29/10
See application file for complete search history.

(56) References Cited

U.S. PATENT DOCUMENTS

| | | | | |
|---|---|---|---|---|
| 5,640,354 | A | * | 6/1997 | Jang ...................... G11C 29/46 365/201 |
| 6,925,620 | B2 | | 8/2005 | Elzinga |
| 7,134,058 | B2 | | 11/2006 | Lauga |
| 2001/0022752 | A1 | * | 9/2001 | Duesman ............... G11C 29/34 365/201 |
| 2005/0102590 | A1 | * | 5/2005 | Norris .................... G11C 29/08 714/719 |
| 2006/0053353 | A1 | * | 3/2006 | Youn .................. G11C 29/1201 714/718 |
| 2012/0215960 | A1 | | 8/2012 | Shi-Huei et al. |
| 2014/0064009 | A1 | | 3/2014 | Lee |
| 2018/0181344 | A1 | * | 6/2018 | Tomishima ............. G06F 13/38 |

OTHER PUBLICATIONS

International Search Report for PCT Application No. PCT/US2018/039820 PCT; ISRWO dated Oct. 24, 2018; 14 Pages.

* cited by examiner

*Primary Examiner* — Samir W Rizk
(74) *Attorney, Agent, or Firm* — Fletcher Yoder, P.C.

(57) ABSTRACT

A memory device may include a command controller and a memory array with multiple memory cells. The command controller may receive commands to write a data pattern to the memory cells of the memory array. The data pattern may be repeated across multiple cells of the memory array without further input from input/output data lines. Additionally, the memory device may include one or more counters to assist in accessing the memory cells of the memory array.

21 Claims, 3 Drawing Sheets

DEVICES AND METHODS TO WRITE BACKGROUND DATA PATTERNS IN MEMORY DEVICES

BACKGROUND

Embodiments described herein relate generally to the field of memory devices. More specifically, the current embodiments include one or more systems, devices, and methods for writing data patterns and utilizing shared address counters for multiple modes of operation.

DESCRIPTION OF RELATED ART

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Various modes of operation in memory devices may require access to large sections or all of the memory array on the memory device. For instance, in certain instances, such as testing, the memory device may be set to a mode such that each memory cell of the memory array may be individually accessed. The accessing of each memory cell in certain modes of operation may be an iterative process such that each of the memory cells in the memory array is sequentially accessed. In order to facilitate such functionality, it may be desirable to provide fast and efficient methods and structures for allowing access to each memory cell in a sequential manner. Further, such sequential access should be provided without necessitating the usage of extra hardware components which may increase cost of the memory device and increase the size of the memory device. Accordingly, embodiments described herein may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As is described in detail below, memory devices may employ modes of operation that facilitate sequential access to all memory cells or large blocks of memory cells in a memory array. For instance, in double data rate type five synchronous dynamic random access memory (DDR5 SDRAM), certain modes of operation, such as the Fast Zero mode, Error Check and Scrub (ECS), and the Data Pattern Test (DPT) mode, provide that each cell of the memory array is sequentially accessed. In order to sequentially access each memory cell, one or more commands may be received by the memory device. Controllers in the memory device may be used to generate internal memory addresses such that each cell can be individually accessed. One or more counters may be used to sequence through internal addresses to access each memory cell of the array. Because counters may increase the cost and/or size of the memory device, present embodiments may share the same counters in utilizing each of the Fast Zero mode and the DPT mode, to minimize the additional hardware used to generate the address sequencing to access the entire memory array. As will be appreciated, sequential access may be characterized by any logical sequence (e.g., [0, 1, 2, 3 . . . ], [1, 3, 5, 7 . . . ], etc.).

Figure 1:
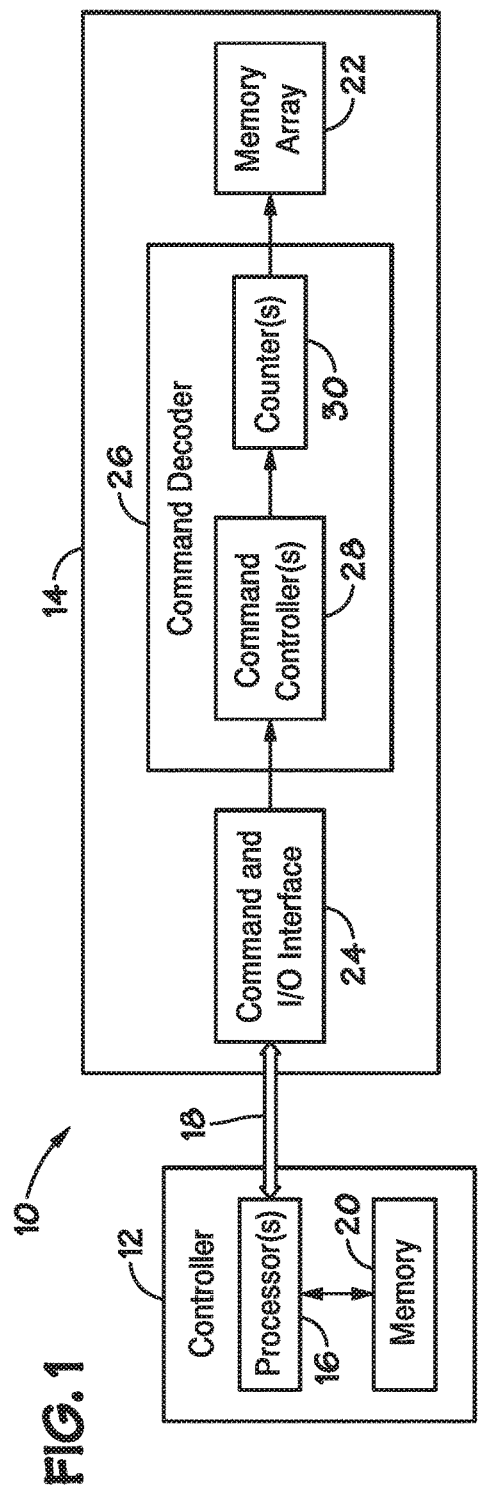
FIG. 1 is a block diagram illustrating a computer system, in accordance with an embodiment of the present invention.

Referring now to FIG. 1, a simplified block diagram of a computer system 10 is illustrated. The computer system 10 includes a controller 12 and a memory device 14. The controller 12 may include processing circuitry, such as one or more processors 16 (e.g., one or more microprocessors), that may execute software programs to provide various signals to the memory device 14 over one or more bi-directional communication buses 18 to facilitate the transmission and receipt of data to be written to or read from the memory device 14. Moreover, the processor(s) 16 may include multiple microprocessors, one or more "general-purpose" microprocessors, one or more special-purpose microprocessors, and/or one or more application specific integrated circuits (ASICS), or some combination thereof. For example, the processor(s) 16 may include one or more reduced instruction set (RISC) processors. The controller 12 may be coupled to one or more memories 20 that may store information such as control logic and/or software, look up tables, configuration data, etc. In some embodiments, the processor(s) 16 and/or the memory 20 may be external to the controller 12. The memory 20 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 20 may store a variety of information and may be used for various purposes. For example, the memory 20 may store machine-readable and/or processor-executable instructions (e.g., firmware or software) for the processor(s) 16 to execute, such as instructions for providing various signals and commands to the memory device 14 to facilitate the transmission and receipt of data to be written to or read from the memory device 14.

The memory device 14 includes a memory array 22 of individual memory cells. As described further below, the memory array 22 may include one or more memory banks that may be grouped or partitioned in a variety of ways to provide access to the cells of the memory array 22, as described below. The controller 12 may communicate with the memory device 14 through one or more command and input/output (I/O) interfaces 24. In general, the command and input/output interfaces 24 provide access to various components of the memory device 14 by external devices, such as the controller 12.

The memory device 14 may also include a command decoder 26. The command decoder 26 may receive command signals from the command and input/output (I/O) interfaces 24 and may decode the command signals to provide various internal commands. For instance, the command decoder 26 may decode commands, such as read commands, write commands, mode-register set commands, activate commands, etc., and provide access to specified regions of the memory array 22. As described above, certain modes of operation, such as the Fast Zero mode and the DPT mode, may facilitate sequential access to individual cells of the memory array 22. To facilitate this functionality, the command decoder 26 includes a command controller 28 that includes one or more individual controllers to control the address sequencing when a particular mode entry command (e.g., Fast Zero or DPT) is received. Further, in order to generate internal addresses to be accessed sequentially, one or more counters 30 may also be provided. Advantageously, the counters 30 may be shared such that they can be used in any mode of operation that may require address sequencing of all or large portions of the memory array 22, such as the Fast Zero mode or the DPT mode. The use and implementation of the command controller 28 and the counters 30 will be described in greater detail below. It should be noted that while the command controller 28 and counters 30 are illustrated as being part of the command decoder 26, alternatively, these elements may be provided elsewhere on the memory device 14.

Figure 2:
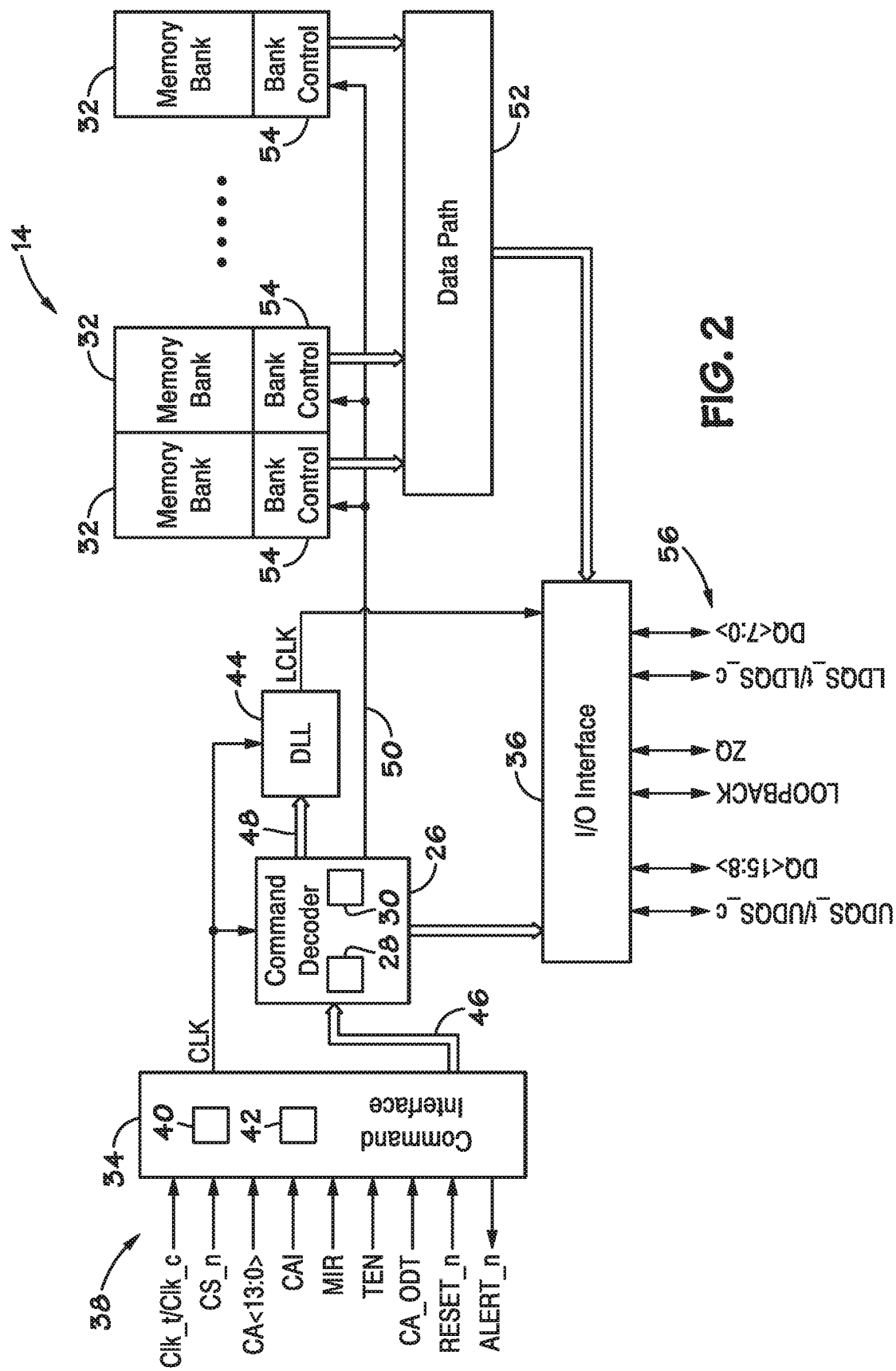
FIG. 2 is a block diagram illustrating a memory device, in accordance with an embodiment of the present invention.

FIG. 2 is a simplified block diagram illustrating certain additional features of the memory device 14 of FIG. 1. Specifically, the block diagram of FIG. 2 is a functional block diagram illustrating certain additional features and related functionality of the memory device 14. In accordance with one embodiment, the memory device 14 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM.

The memory device 14, may include a memory array logically and functionally grouped into a number of memory banks 32. The memory banks 32 may be DDR5 SDRAM memory banks, for instance. The memory banks 32 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 32. The memory device 14 represents a portion of a single memory chip (e.g., SDRAM chip) having a number of memory banks 32. For DDR5, the memory banks 32 may be further arranged to form bank groups. For instance, for an 8 gigabit (Gb) DDR5 SDRAM, the memory chip may include 16 memory banks 32, arranged into 8 bank groups, each bank group including 2 memory banks. For a 16 Gb DDR5 SDRAM, the memory chip may include 32 memory banks 32, arranged into 8 bank groups, each bank group including 4 memory banks, for instance. Various other configurations, organization and sizes of the memory banks 32 on the memory device 14 may be utilized depending on the application and design of the overall system.

As previously described, the memory device 14 may include one or more command and input/output (I/O) interfaces. For instance, the memory device 14 may include a command interface 34 and an input/output (I/O) interface 36. The command interface 34 is configured to provide a number of signals (e.g., signals 38) from an external device (not shown), such as a processor or controller. The processor or controller may provide various signals 38 over one or more bi-directional data buses (e.g., data bus 18) to and from the memory device 14 to facilitate the transmission and receipt of data to be written to or read from the memory device 14.

As will be appreciated, the command interface 34 may include a number of circuits, such as a clock input circuit 40 and a command address input circuit 42, for instance, to ensure proper handling of the signals 38. The command interface 34 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 40 receives the true clock signal (Clk_t) and the complementary clock signal (Clk_c) and generates an internal clock signal CLK. The internal clock signal CLK is supplied to an internal clock generator 44, such as a delay locked loop (DLL) circuit. The internal clock generator 44 generates a phase controlled internal clock signal LCLK based on the received internal clock signal CLK. The phase controlled internal clock signal LCLK is supplied to the I/O interface 36, for instance, and is used as a timing signal for determining an output timing of read data.

The internal clock signal CLK may also be provided to various other components within the memory device 14 and may be used to generate various additional internal clock signals. For instance, the internal clock signal CLK may be provided to a command decoder 26. The command decoder 26 may receive command signals from the command bus 50 and may decode the command signals to provide various internal commands. For instance, the command decoder 26 may provide command signals to the internal clock generator 44 over the bus 48 to coordinate generation of the phase controlled internal clock signal LCLK. The phase controlled internal clock signal LCLK may be used to clock data through the I/O interface 36, for instance.

Further, the command decoder 26 may decode commands, such as read commands, write commands, activate commands, mode-register set commands, such as Fast Zero Entry and DPT commands, etc., and provide access to a particular memory bank 32 corresponding to the command, via the bus path 52. As will be appreciated, the memory device 14 may include various other decoders, such as row decoders and column decoders, to facilitate access to the memory banks 32. In one embodiment, each memory bank 32 includes a bank control block 54 which provides the necessary decoding (e.g., row decoder and column decoder), as well as other features, such as timing control and data control, to facilitate the execution of commands to and from the memory banks 32.

As previously described with regard to FIG. 1 and described further below with regard to FIGS. 3 and 4, the command decoder 26 may include one or more command controllers 28 to facilitate certain functions, such as implementation of the Fast Zero Entry mode and DPT mode of operation. In addition, the command decoder 26 may include one or more counters 30 that may be utilized under control of the command controller(s) 28 to generate internal addresses for sequential access of cells of the individual storage locations within each memory bank 32, as described in greater detail below. Advantageously, by utilizing the same set of counters 30 for each of the various modes of operation that employ sequential accessing schemes, such as Fast Zero and DPT modes, rather than employing individual counters for each independent mode, the inclusion of additional hardware components (e.g., counters) can be avoided.

The memory device 14 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 34 using the clock signals (Clk_t and Clk_c). The command interface 34 may include a command address input circuit 42 which is configured to receive and transmit the commands to provide access to the memory banks 32, through the command decoder 26, for instance. In addition, the command interface 34 may receive a chip select signal (CS_n). The CS_n signal enables the memory device 14 to process commands on the incoming CA<13:0> bus. Access to specific banks 32 within the memory device 14 is encoded on the CA<13:0> bus with the commands.

In addition, the command interface 34 may be configured to receive a number of other command signals. For instance, a command/address on die termination (CA_ODT) signal may be provided to facilitate proper impedance matching within the memory device 14. A reset command (RESET_n) may be used to reset the command interface 34, status registers, state machines and the like, during power-up for instance. The command interface 34 may also receive a command/address invert (CAI) signal which may be provided to invert the state of command/address signals CA<13:0> on the command/address bus, for instance, depending on the command/address routing for the particular memory device 14. A mirror (MIR) signal may also be provided to facilitate a mirror function. The MIR signal may be used to multiplex signals so that they can be swapped for enabling certain routing of signals to the memory device 14, based on the configuration of multiple memory devices in a particular application. Various signals to facilitate testing of the memory device 14, such as the test enable (TEN) signal, may be provided, as well. For instance, the TEN signal may be used to place the memory device 14 into a test mode for connectivity testing.

The command interface 34 may also be used to provide an alert signal (ALERT_n) to the system processor or controller for certain errors that may be detected. For instance, an alert signal (ALERT_n) may be transmitted from the memory device 14 if a cyclic redundancy check (CRC) error is detected. Other alert signals may also be generated. Further, the bus and pin for transmitting the alert signal (ALERT_n) from the memory device 14 may be used as an input pin during certain operations, such as the connectivity test mode executed using the TEN signal, as described above.

Data may be sent to and from the memory device 14, utilizing the command and clocking signals discussed above, by transmitting and receiving data signals 56 through the I/O interface 36. More specifically, the data may be sent to or retrieved from the memory banks 32 over the data path 52, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 14, certain memory devices, such as DDR memory devices may utilize data strobe signals, generally referred to as DQS signals. The DQS signals are driven by the external processor or controller sending the data (e.g., for a write command) or by the memory device 14 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 14, for instance.

An impedance (ZQ) calibration signal may also be provided to the memory device 14 through the IO interface 36. The ZQ calibration signal may be provided to a reference pin and used to tune output drivers and ODT values by adjusting pull-up and pull-down resistors of the memory device 14 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 14 and GND/VSS external to the memory device 14. This resistor acts as a reference for adjusting internal ODT and drive strength of the IO pins.

In addition, a loopback signal (LOOPBACK) may be provided to the memory device 14 through the IO interface 36. The loopback signal may be used during a test or debugging phase to set the memory device 14 into a mode wherein signals are looped back through the memory device 14 through the same pin. For instance, the loopback signal may be used to set the memory device 14 to test the data output (DQ) of the memory device 14. Loopback may include both a data and a strobe or possibly just a data pin. This is generally intended to be used to monitor the data captured by the memory device 14 at the IO interface 36.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 14), etc., may also be incorporated into the memory system 10. Accordingly, it should be understood that the block diagram of FIG. 2 is only provided to highlight certain functional features of the memory device 14 to aid in the subsequent detailed description.

Figure 3:
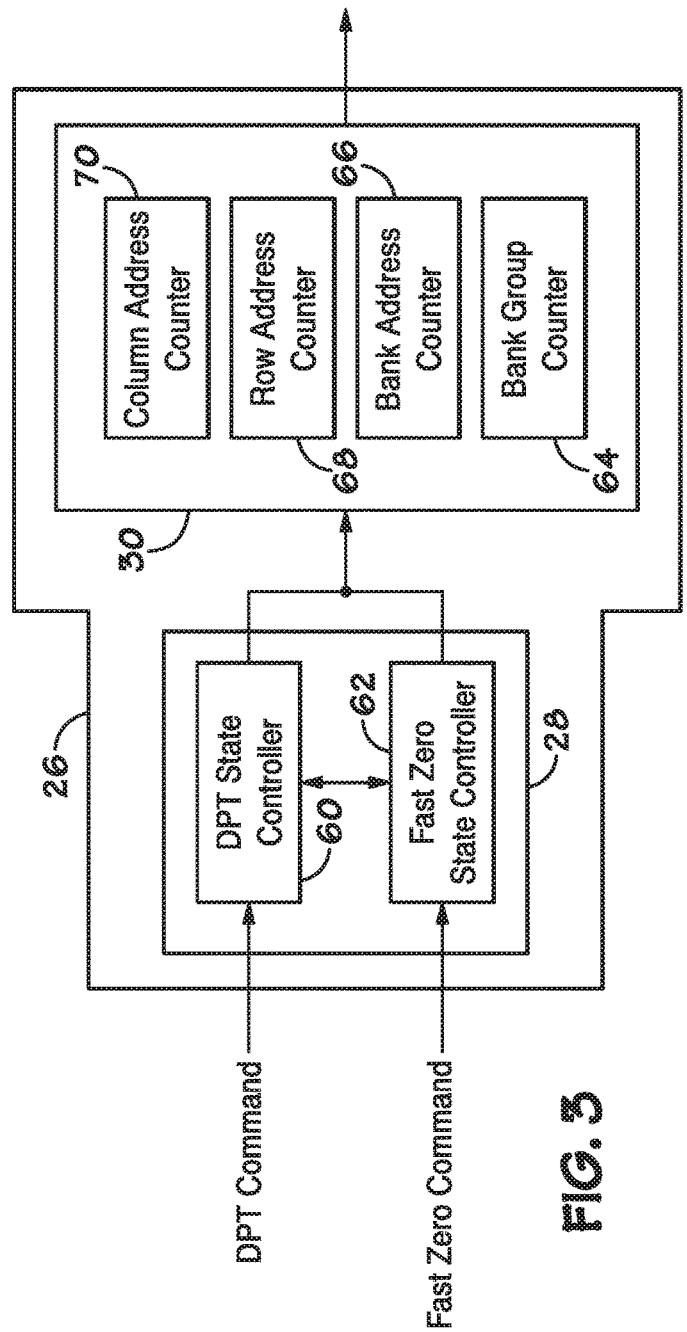
FIG. 3 is a block diagram of a portion of the memory device of FIG. 2, in accordance with an embodiment of the present invention.

Referring now to FIG. 3, a portion of the command decoder 26 is illustrated. As previously described, in certain modes of operation, each of the individual memory cells of the memory array 22 may be sequentially accessed. For instance, certain modes of operation, such as the Fast Zero mode and the Data Pattern Test mode, may facilitate sequential access to individual cells of the memory array 22 and coordinate the generation of internal memory addresses by the counter 30. To facilitate this functionality, the command decoder 26 includes a command controller 28 that includes one or more individual controllers 60 and 62 to control the address sequencing when a particular mode entry command (e.g., Fast Zero Entry command or DPT Command) is received.

In the illustrated embodiment, the command controller 28 includes Fast Zero state controller 62 configured to receive a Fast Zero command. The Fast Zero command may be asserted by one of the processors 16 in the external controller 12 as part of the device power-up and initialization sequence, for instance. The Fast Zero state controller 62 is configured to write logical 0s to each of the memory cells of the memory array 22. As discussed in more detail below, while the Fast Zero mode of operation is utilized to write logical 0s to each of the memory locations, a similar mode register command could also be used to write other known values to each of the memory locations (e.g., all logical 1s, or a specified and known pattern). When the Fast Zero command is received by the fast zero mode controller 62, the Fast Zero state controller 62 will cycle through the entire memory array 22, sequentially writing a zero to each memory cell. To sequentially write to each memory cell, one or more counters 30 may be employed to generate internal memory addresses by sequentially incrementing the counters 30. In accordance with one embodiment, the counters 30 may include a bank group counter 64, a bank address counter 66, a row address counter 68 and a column address counter 70.

In accordance with the present embodiments, a DPT state controller 60 may also be provided to facilitate receipt and control of a DPT command. The DPT command may place the memory device 14 in proper condition to conduct a Data Pattern Test. Using the DPT state controller 60, the memory device 14 can quickly write a specific data pattern to all or a portion of the memory cells of the memory array 22. As with the Fast Zero state controller 62, the DPT state controller 60 facilitates the generation of internal memory addresses using the counters 30, in order to sequentially access each individual memory cell of the memory array.

Writing a specific data pattern to the memory array 22 of a memory device 14 quickly may be especially beneficial during production and manufacture of memory devices 14 and/or for quality control. The Data Pattern Test may be used alone or in conjunction with other tests to check for leakages, shorts, read/write errors or other issues that may affect the performance of the memory device 14. In order to accurately test for these and other issues, the memory array 22 of the memory device 14 may be stressed by writing a known data pattern to a portion or all of the memory cells. Writing a specific pattern, instead of all 0s such as in the Fast Zero mode (i.e., a non-zero pattern), may yield more telling results of the condition of the memory device 14. For example, if all 0s or 1s were written to a memory device 14, it may be straightforward to find certain read/write errors. However, writing all 0s may not give accurate information about leakages and or shorts, as adjacent cells already have the same value. With this in mind, distinct patterns of 1s and 0s may be better suited for exposing these and other errors.

However, traditionally, a data pattern would typically be written as regular data, cell-by-cell from incoming data on the I/O interface 36. Thus, writing a data pattern across the entire memory array 22 may be very time consuming, especially for large capacity memory devices 14. Therefore, being able to write a known data pattern quickly may decrease overall test time, and, thus, increase production. As such, the Data Pattern Test may allow the data pattern to be repeated internally using the counters 30 to quickly access and write to each cell, and, therefore, not utilize incoming data on the I/O interface 36 and/or data path 52 for each write.

Although beneficial during manufacturing, as would be appreciated, the Data Pattern Test mode may also be entered post-production. For example, periodic integrity checks throughout the life of the memory device 14 may be undergone utilizing the DPT mode. Such checks may be done upon initialization or power-up of the memory device 14 and/or controller 12 or any other suitable time such as when the memory device 14 is idle. Implementation of the DPT mode may be initialized by the controller 12 and may be scheduled or user initiated. There may also be scenarios outside of production and testing where quickly writing a known pattern may be of value, particularly when efficient programming, reading, and/or writing is necessitated.

As stated above, the DPT state controller 60 may be utilized to write a specific data pattern to the memory cells of the memory array 22. For example, a "checkerboard" pattern may consist of alternating 1s and 0s on a row with the adjacent row(s) being the inverse. Other patterns may take the form of stripes (i.e., alternating rows or columns of 1s and 0s), a walking $4^{th}$ or $8^{th}$ (i.e., "0001" repeating or "00000001" repeating), or any other pattern or repeating sequence. Alternatively, a single non-repetitive pattern may be written to the memory array 22 instead of repeated segments. For example, each cell value may be based on the cell's column and row addresses. Patterns may also be written multiple rows at a time. For example, a particular pattern may include 4 distinct rows that are to be repeated throughout the memory array 22. In this case, the same pattern would be written to each of rows 0, 4, 8, 12, and so on. Likewise, the same pattern would also be written to each of rows 1, 5, 9, 13, and so. Since every fourth row is to receive the same pattern, multiple rows may be written at once by having multiple rows active when writing. In some embodiments, all rows to receive the same pattern may be written at one time. In other embodiments, 4 rows may be written at once. As will be appreciated, any number of similar rows may be written at once, and, therefore, further reduce the time to completion. As will also be appreciated, the pattern may be written by column instead of by row. For example, a single row may be selected and multiple columns may be written to at one time.

In some embodiments, one or more initial rows may be written to prior to repeating the pattern to other rows. This initial row(s) may receive the pattern first to define and internalize the pattern. Multiple initial rows may be used if the pattern to be written has multiple different rows. For example, a 4 row pattern may have 4 initial rows, whereas a striped or checkerboard pattern may only have 2 initial rows. These initial rows may then be utilized to write to the rest of the memory array 22, instead of receiving the pattern through the I/O interface 36 and/or data path 52 for each write, thus, further reducing the time to completion and congestion of these buses.

In one embodiment, each of the Fast Zero mode and the DPT mode utilize the same set of counters 30 to generate the internal memory addresses that facilitate sequential access to each memory cell, for the particular mode of operation. By utilizing the same shared counters 30 for multiple modes of operation that provide for the generation of internal memory addresses to sequentially access each cell of the memory array 22, hardware components and valuable real estate on the memory device may be conserved. As will be appreciated, the Data Pattern Test mode may also utilize separate counters 30 from the Fast Zero mode or be implemented on a memory device 14 without Fast Zero mode.

In the present embodiment, four counters are provided in order to facilitate the various groupings of cells for sequential access. Specifically, a bank group counter 64 is provided to switch from one bank group to another during sequential accessing of the memory array 22. In one embodiment, the memory array 22 may include four bank groups and the bank group counter 64 is a 2-bit counter. A bank address counter 66 is also provided to switch from one bank to another during sequential accessing of the memory array 22. In one embodiment, the memory array 22 may include two or four banks and the bank address counter 66 is a 1-bit or 2-bit counter. A row address counter 68 is also provided to switch from one row to another during sequential accessing of the memory array 22. In one embodiment, the memory array 22 may include 65,536 rows and the row address counter 68 is a 16-bit counter. Finally, in the illustrated embodiment, a column address counter 70 is also provided to switch from one column to another during sequential accessing of the memory array 22. In one embodiment, the memory array 22 may include 128 columns and the row address counter 70 is a 7-bit counter.

In addition to sharing counters 30, the DPT mode and Fast Zero mode may additionally share the use of the Fast Zero state controller 62. As described above, the Fast Zero state controller 62 oversees the implementation of writing 0s to the memory array 22 and utilizes the counters 30. In one embodiment, the DPT state controller 60 overrides certain aspects of the Fast Zero state controller 62 to facilitate writing a pattern to the memory array 22. For example, when activating rows, the DPT state controller 60 may choose to have every other or every fourth row activated (depending on the pattern) instead of sequentially activating every row. As such, activating the Fast Zero command may be a part of the DPT mode process. However, the DPT state controller 60 may also keep the Fast Zero state controller 62 from writing 0s and instead write the pattern in the initial rows. To accomplish this, the DPT state controller 60 may usurp control of the data line that feeds the memory cells. This control may be embodied in the form of a data lock. The data lock may force the data lines to be suspended so that excess commands, such as the Fast Zero command to write 0s, do not take effect. In this manner of further shared resources, valuable space on and cost of the memory device may be conserved.

While the presently described embodiments include counters 30 that are shared when the memory device 14 is in a Fast Zero Mode of operation or a DPT mode of operation, the counters 30 may be shared for other modes of operation, as well. For instance, if other test or setup modes employ sequential accessing of the entire memory array 22, or large portions of the memory array (e.g., an entire memory bank or bank group), the counters 30 can also be shared for these additional modes of operation, as well. Further, in certain embodiments of the memory device 14, it may be that not all of the illustrated counters in the counter block 30 are utilized. For instance, certain memory devices 14 may only employ one bank group. In such a device, the bank group counter 64 may not be utilized or may be omitted entirely from the memory device 14. Further, in certain embodiment of memory devices, additional counters 30 may be employed if other groupings of memory cells are provided.

Figure 4:
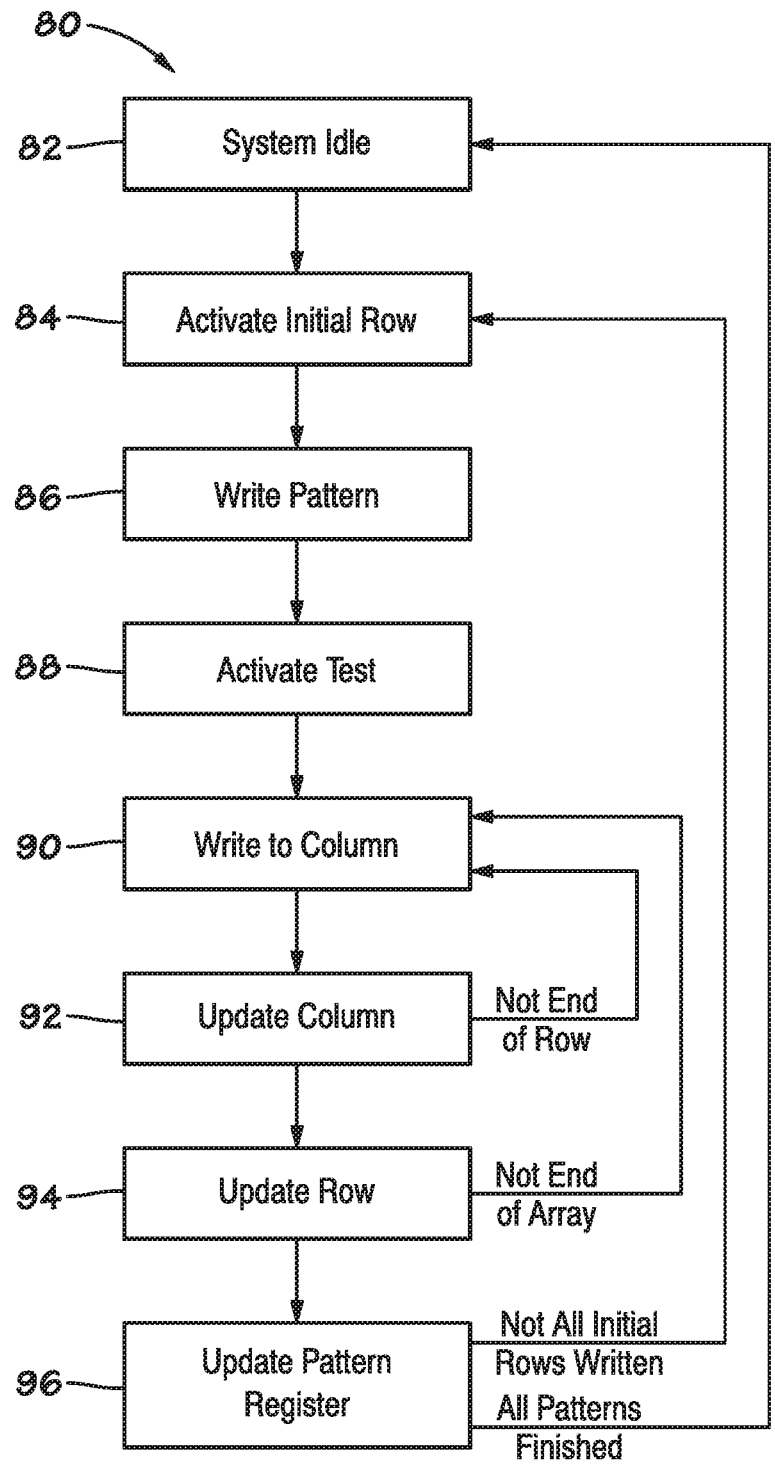
FIG. 4 is a flow chart illustrating a Data Pattern Test mode of operation of the memory device of FIG. 3, in accordance with an embodiment of the present disclosure.

Turning now to FIG. 4, a flow chart 80 illustrating an example of an implementation of a Data Pattern Test mode sequence is provided. As previously described, the Data Pattern Test mode may be entered during an initialization or power-up of the memory device 14 or at any idle period. Before the DPT command is received by the DPT state controller 60, the memory device 14 may be in a System Idle State 82. Upon receipt of the DPT command, the DPT state controller 60 issues an activate command for an initial row (e.g., row 0), as indicated by the Activate Initial Row State 84. Once activated, the initial row can receive the selected pattern via the I/O interface 36 and data path 52, as indicated by the Write Pattern State 86. As will be appreciated, patterns may also be inherently stored on the memory device 14 or received in any suitable manner, such as from the controller 12. Additionally, a pre-charge state may also occur once the data is written to deactivate the initial row.

The Activate Test State 88 indicates the activation of other rows in the memory array 22 that are to receive the same pattern as the initial row. Multiple other rows may be activated simultaneously to facilitate writing to multiple rows at once. A column of the activated rows may then be written to match the column of the initial row as indicated by Write to Column State 90. After a column is written, the counters 30 are used to generate the next sequential memory address in the activate row(s) and move the operation to the next column by deactivating the written column and activating the subsequent column as indicated by Update Column State 92. If the process has not reached the end of the row, the state returns to the Write to Column State 90 and repeats until the row is finished. Similarly, when the row is complete, the counters may deactivate the written rows and activate one or more further rows to be written, as indicated by the Update Row State 94. If further rows are yet to be written, the state may return to the Write to Column State 90 and repeat until the entire memory array 22, or interested portion(s) thereof are completed.

If all rows were written at once, or if all rows receiving the initial row pattern have been written, the process may enter the Update Pattern Register State 96. During this state, the DPT state controller 60 monitors which patterns/initial rows have been written, and proceeds to the subsequent pattern when necessary. For example, in a 4 row pattern, row 0 may be the initial row receiving the first row of the 4 row pattern. Once every fourth row (beginning with row 0) has been written, the DPT state controller 60 may be updated to proceed to the next row in the 4 row pattern. As such, row 1 may be the next initial row and every fourth row henceforth may be written to repeat row 1. If not all of the initial rows have been written, and, therefore, not all the memory array 22 has been written to the pattern, the Update Pattern Register State 96 may return the process to the Activate Initial Row State 84, and repeat until the memory array 22 has been completed with the pattern. Once the entire memory array 22, or portion of interest thereof has been written with the pattern, the process may return to an idle state for further use.

As will be appreciated, although the flow chart 80 is shown in a given order, in certain embodiments, states may be reordered, altered, deleted, and/or occur simultaneously. For example, a 4 row pattern may have all 4 initial rows written during the first Activate Initial Row State 84, instead of just the first initial row. In another embodiment, the entire pattern may be written repeatedly. For example, after writing a 4 row pattern to 4 initial rows, the pattern may be repeated such that rows 4-7 are written, thus completing the pattern a second time, before writing any further rows. Furthermore, additional states may also occur throughout such as precharge states, read states, comparison states, or states referring to other tests or applications.

Because every memory cell, or a portion thereof, is to be written to (e.g., as part of a pattern) during the DPT mode of operation and the internal counters 30 are being controlled to generate the internal addresses to step through the memory cells in an ordered manner, a new DPT command need not be generated during the DPT mode of operation. That is, once the initial DPT command is sent, the DPT state controller 60 may repeat the steps indicated in the state diagram 80 without having to generate another DPT command. Thus, the Activate Initial Row State 84 may not necessarily refer to the assertion of a DPT command once the initial command is sent.

In the embodiment illustrated by the flow chart 80, the process is repeated until the pattern written into each row of the memory array 22. Thus, the illustrated flow chart 80 indicates a process whereby only the row address counter 68 and column address counter 70 are utilized. That is, each bank may be activated and written to in parallel and thus, the bank address counter 66 need not be incremented. In alternative embodiments, each bank may be written to sequentially, such that the process includes incrementing of the bank address counter 66, once each column of each row of the bank is written to. Further, in one embodiment, the memory array may only include a single bank group and therefore, the bank group counter 64 may not be employed. However, those skilled in the art will appreciate that for memory arrays having multiple bank groups, the bank group counter 64 may be similarly employed for generation of the internal memory addresses to sequentially access the memory cells in additional banks.

While the current techniques may be susceptible to various modifications and alternative forms, specific embodiments have been shown by way of example in the drawings and have been described in detail herein. However, it should be understood that the current techniques are not intended to be limited to the particular forms disclosed. Rather, instead the present embodiments are intended to cover all modifications, equivalents, and alternatives falling within the spirit and scope of the present techniques as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
a memory array comprising a plurality of memory cells;
a first controller configured to receive a first command to initiate a first mode and facilitate writing a data pattern to at least some of the plurality of memory cells, wherein the Data Pattern Test mode is configured to write the data pattern to the plurality of memory cells in the memory array while only receiving the data pattern via an external source once;
a second controller configured to receive a second command to initiate a second mode different from the first mode;
a data lock configured to, in response to the first controller receiving the first command, suspend the second command or an output of the second controller such that the first controller usurps control of a data line of the plurality of memory cells; and
one or more counters configured to generate internal memory addresses to sequentially access the plurality of memory cells.

2. The memory device of claim 1, wherein the one or more counters comprise a bank address counter.

3. The memory device of claim 1, wherein the data pattern is written to the entire memory array.

4. The memory device of claim 1, wherein the data pattern is repeated a plurality of times across the memory cells.

5. The memory device of claim 1, wherein the second controller comprises a Fast Zero controller configured to receive the second command comprising a Fast Zero command to initiate a Fast Zero mode to write logical 0s to each of the plurality of memory cells in the memory array, and wherein the first controller comprises a Data Pattern Test controller configured to receive the first command comprising a Data Pattern Test command to initiate the Data Pattern Test mode to write the data pattern to the plurality of memory cells in the memory array.

6. The memory device of claim 5, wherein the Fast Zero controller and the Data Pattern Test controller share the one or more counters configured to generate internal memory addresses to sequentially access the plurality of memory cells to write the data pattern to the memory cells.

7. The memory device of claim 5, wherein the Data Pattern Test controller modifies the Fast Zero mode to write the data pattern to the plurality of memory cells in the memory array.

8. The memory device of claim 1, wherein the memory device comprises a double data rate type five synchronous dynamic random access memory (DDR5 SDRAM).

9. The memory device of claim 1, wherein the memory array comprises a plurality of rows and a plurality of columns, and each of the plurality of memory cells are identified by a column address and a row address.

10. The memory device of claim 1, wherein the data pattern is written to multiple of a plurality of rows of a single bank simultaneously.

11. The memory device of claim 1, wherein the data pattern comprises a multi-row pattern.

12. The memory device of claim 11, wherein the multi-row pattern comprises a checkerboard pattern.

13. The memory device of claim 1, wherein the one or more counters comprise a column address counter and a row address counter.

14. A system comprising:
a controller; and
a random access memory device communicatively coupled to the controller, wherein the random access memory device comprises:
a memory array comprising a plurality of memory cells; and
one or more command controllers configured to receive one or more commands and facilitate writing a non-zero data pattern to at least some of the plurality of memory cells, wherein repeated rows of the data pattern are written simultaneously to rows of a memory bank, and wherein the data pattern comprises a multi-row pattern, and wherein a first row of the multi-row pattern is different from a second row of the multi-row pattern.

15. The system of claim 13, wherein the memory array comprises a plurality of memory banks, wherein each of the plurality of memory banks includes a portion of the plurality of memory cells.

16. The system of claim 13, wherein the controller sends the one or more commands to the one or more command controllers to initiate writing the data pattern to the plurality of memory cells.

17. The system of claim 13, wherein the controller supplies the random access memory device with the data pattern to be written to the memory array.

18. A method, comprising:
   receiving, at a command controller of a random access memory device, a command to initiate a Data Pattern Test mode to write a data pattern to a memory array of the random access memory device;
   implementing at least one of a plurality of counters to facilitate access of a plurality of memory cells of the memory array, in response to the command to write the data pattern, wherein the at least one of the plurality of counters is shared by the Data Pattern Test mode and at least one other mode; and
   writing the data pattern to the memory array, wherein the data pattern is a multi-row pattern, and wherein writing the data pattern to the memory array comprises writing a first row of the multi-row pattern to multiple rows of memory cells before writing a second row of the multi-row pattern to the plurality of memory cells.

19. The method of claim 18, comprising receiving the data pattern via an I/O interface of the random access memory device.

20. The method of claim 19, wherein the data pattern is received via the I/O interface of the random access memory device only once and repeated internally for the remainder of the writing of the data pattern.

21. The method of claim 18, comprising repeating the data pattern over all of the plurality of memory cells of the memory array.

* * * * *

UNITED STATES PATENT AND TRADEMARK OFFICE
CERTIFICATE OF CORRECTION

PATENT NO. : 10,672,496 B2
APPLICATION NO. : 15/792473
DATED : June 2, 2020
INVENTOR(S) : Joshua E. Alzheimer Page 1 of 1

It is certified that error appears in the above-identified patent and that said Letters Patent is hereby corrected as shown below:

In the Claims

Claim 15, delete "The system of claim 13" and insert --The system of Claim 14--, therefor.

Claim 16, delete "The system of claim 13" and insert --The system of Claim 14--, therefor.

Claim 17, delete "The system of claim 13" and insert --The system of Claim 14--, therefor.

Signed and Sealed this
Fourth Day of August, 2020

Andrei Iancu
*Director of the United States Patent and Trademark Office*